United States Patent
Oikawa (10) Patent No.: US 8,261,813 B2
(45) Date of Patent: Sep. 11, 2012

(54) ELECTRONIC DEVICE COOLING APPARATUS AND ELECTRONIC DEVICE INCLUDING THE SAME

(75) Inventor: Hironori Oikawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 664 days.

(21) Appl. No.: 12/233,117

(22) Filed: Sep. 18, 2008

(65) Prior Publication Data

US 2009/0266515 A1    Oct. 29, 2009

(30) Foreign Application Priority Data

Apr. 24, 2008   (JP) ................................ 2008-114025

(51) Int. Cl.
   *F28F 7/00*   (2006.01)
(52) U.S. Cl. ............. 165/80.4; 165/104.33; 165/104.28; 165/104.31
(58) Field of Classification Search ............. 165/104.33, 165/104.28, 80.4, 104.31, 104.19, 108; 361/699
   See application file for complete search history.

(56) References Cited

U.S. PATENT DOCUMENTS

| | | | | |
|---|---|---|---|---|
| 7,414,843 B2* | 8/2008 | Joshi et al. | ..................... | 361/699 |
| 7,597,135 B2* | 10/2009 | Ghosh et al. | .................. | 165/80.4 |
| 7,688,589 B2* | 3/2010 | Chiang | .......................... | 361/699 |
| 2004/0104022 A1* | 6/2004 | Kenny et al. | .................... | 165/299 |
| 2008/0105407 A1* | 5/2008 | Yeh et al. | ................. | 165/104.28 |
| 2008/0105413 A1* | 5/2008 | Peng | ........................ | 165/104.33 |
| 2008/0264604 A1* | 10/2008 | Campbell et al. | ............ | 165/80.4 |
| 2009/0065178 A1 | 3/2009 | Kasezawa et al. | | |

FOREIGN PATENT DOCUMENTS

| | | | |
|---|---|---|---|
| JP | 04-348553 | | 12/1992 |
| JP | 04348553 A | * | 12/1992 |
| JP | 05-299549 | | 11/1993 |
| JP | 2006-100692 | | 4/2006 |
| JP | 2006-324647 | | 11/2006 |
| JP | 2007-142068 | | 6/2007 |

OTHER PUBLICATIONS

Japanese Office Action, Issued in Japanese Patent Application No. 2008-114025, dated Aug. 9, 2011.

* cited by examiner

*Primary Examiner* — Henry Yuen
*Assistant Examiner* — Devon Russell
(74) *Attorney, Agent, or Firm* — McDermott Will & Emery LLP (57) ABSTRACT

As an electronic device cooling apparatus which allows refrigerant liquid to circulate and flow in a cooling system by using a pump so as to cool a heat generating portion of an electronic device, a heat generating portion cooling unit which is connected to the pump, which receives heat from the heat generating portion of the electronic device, and which releases the heat to the refrigerant liquid through a fin portion so as to cool the heat generating portion includes independently therein a first flow channel through which the refrigerant liquid discharged from a discharging port of the pump is drawn in to be guided to the outside of the heat generating portion cooling unit through the fin portion, and a second flow channel through which the refrigerant liquid cooled at the outside is drawn in to be guided towards a sucking port of the pump.

16 Claims, 6 Drawing Sheets

ELECTRONIC DEVICE COOLING APPARATUS AND ELECTRONIC DEVICE INCLUDING THE SAME

CLAIM OF PRIORITY

The present application claims priority from Japanese patent application serial No. P2008-114025, filed on Apr. 24, 2008, the content of which is hereby incorporated by reference into this application.

BACKGROUND OF THE INVENTION

1. Technical Field of the Invention

The present invention relates to a cooling apparatus of an electronic device such as a personal computer, and particularly to a configuration of a cooling apparatus of a type which allows refrigerant liquid to circulate in a cooling system by using a pump.

2. Description of the Related Art

In recent years, high-performance semiconductor integrated circuits such as CPUs of personal computers are mounted in electronic devices. High speed and high integration of the semiconductor integrated circuits has been rapidly advanced along with demands for high-performance electronic devices, and the heating value thereof has increased as compared to that of the conventional circuits. When the heating value of the semiconductor integrated circuits increases and rises beyond a predetermined value, it is difficult to maintain the performance of the semiconductor integrated circuits and the circuits are damaged in some cases. Therefore, cooling is necessary for preventing the temperature rise of the semiconductor integrated circuits.

In place of a conventional cooling system of an air-cooling type in which forcible ventilation to a hear sink is conducted by a fan, there has been recently developed a cooling technique of a liquid-cooling type, as a cooling technique with high cooling performance and low noise, in which refrigerant liquid is allowed to circulate in a cooling system by a pump and heat generated at a heat generating portion such as a semiconductor integrated circuit is released to the refrigerant liquid from a fin portion in the cooling system.

Figure 6:
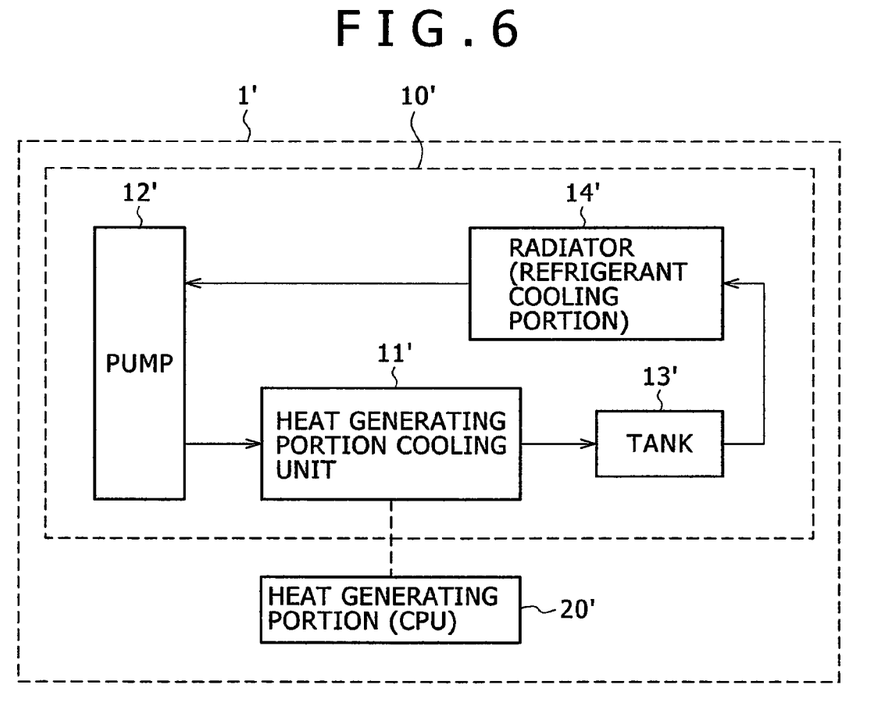
FIG. 6 is a view showing a conventional example of the present invention.

FIG. 6 shows a configuration example of an already-commercialized cooling apparatus for cooling a CPU of a personal computer. In FIG. 6, a cooling apparatus 10' arranged in a personal computer 1' as an electronic device has a configuration in which a heat generating portion cooling unit 11' including a fin portion (not shown) is arranged in contact with a CPU (Central Processing Unit) 20' that is a heat generating portion, refrigerant liquid (water) is supplied from a discharging port of a pump 12' to the heat generating portion cooling unit 11', the refrigerant liquid is allowed to flow in the fin portion in the heat generating portion cooling unit 11', heat conducted from the CPU 20' is released to the refrigerant liquid in the fin portion so as to prevent temperature rise of the CPU 20', the refrigerant liquid that flows out of the heat generating portion cooling unit 11' is temporarily stored in a tank 13' and then is cooled by a radiator (refrigerant cooling portion) 14', and the cooled refrigerant liquid is supplied to a sucking port of the pump 12'. Piping members connect between the discharging port of the pump 12' and an inflow port of the heat generating portion cooling unit 11', between an outflow port of the heat generating portion cooling unit 11' and an inflow port of the tank 13', between an outflow port of the tank 13' and an inflow port of the radiator (refrigerant cooling portion) 14' and between an outflow port of the radiator (refrigerant cooling portion) 14' and the sucking port of the pump 12'.

Among patent documents, JP-A-2007-142068 and JP-A-2006-100692 describe techniques that are conventional techniques relating to the present invention. JP-A-2007-142068 describes a configuration in which in order to improve the cooling performance with less flowing amount of refrigerant liquid and to easily comply with downsizing with a simple structure as a heat receiving portion of a cooling apparatus, a pump is integrally configured with a fin portion in a casing, refrigerant liquid sucked in the casing is allowed to pass through the fin portion, and then is allowed to flow out to the outside of the casing through an impeller of the pump. JP-A-2006-100692 describes a configuration in which in a cooling apparatus where a pump, a reserve tank, and a radiator are sequentially piled up on a heat receiving portion, a bypass flow channel is provided at the reserve tank and the arrangement of pipes is simplified in order to downsize the apparatus and minimize the reduction of refrigerant liquid.

SUMMARY OF THE INVENTION

The cooling apparatus 10' shown in FIG. 6 has a configuration in which the outflow port of the radiator (refrigerant cooling portion) 14' is connected to the sucking port of the pump 12' through the piping member. Accordingly, in a configuration in which, for example, the pump 12' and the radiator 14' are separately arranged on the both sides of the heat generating portion cooling unit 11', the length between the pump 12' and the radiator 14' becomes long. Therefore, the piping member is also arranged across the long length, and a space for placing the piping member is needed. In addition, when the apparatus is incorporated or used, the piping member, the sucking port of the pump 12', and the outflow port for refrigerant liquid of the radiator 14' are easily damaged by the arrangement structure due to the effects of external force or contact with other portions, and thus there is a possibility of deterioration in reliability of the piping. Further, the arrangement structure hampers further downsizing and low cost of the cooling apparatus 10'.

Further, in the technique described in JP-A-2007-142068, since the pump is integrally configured with the fin portion in the casing, the structure becomes complicated. In addition, it is difficult to use a general-purpose pump due to restriction of the structure and dimension of the pump by the fin portion, and there is a possibility of increasing the cost. In addition, since the structure formed by integrally coupling the pump to the fin portion in the casing is attached to the heat generating portion, there is a possibility that oscillation of the pump is easily conducted to the heat generating portion and the circuit substrate, the heat generating portion and the circuit substrate are damaged and oscillation and noise of the electronic device are increased. It is impossible to exchange one of the pump and the fin portion. Further, the technique described in JP-A-2006-100692 is a technique adapted to the cooling apparatus having a configuration in which three elements of the pump, the reserve tank, and the radiator are sequentially piled up on the heat receiving portion to form one block. It is difficult to adapt the technique to a cooling apparatus in which three elements are piled up in the order of the pump, the radiator, and the reserve tank, or a cooling apparatus in which three elements are not formed as one block.

In view of the foregoing circumstances of the conventional techniques, an object of the present invention is to simplify piping, to improve the reliability, and to realize downsizing and low cost of an electronic device cooling apparatus which allows refrigerant liquid to circulate and flow in a cooling system by using a pump so as to cool a heat generating portion of an electronic device.

The present invention provides a practical electronic device cooling apparatus with high cooling-performance.

Specifically, as an electronic device cooling apparatus of the present invention which allows refrigerant liquid to circulate and flow in a cooling system by using a pump so as to cool a heat generating portion of an electronic device, a heat generating portion cooling unit which is connected to the pump, which receives heat from the heat generating portion, and which releases the heat to the refrigerant liquid through a fin portion so as to cool the heat generating portion independently includes therein a first flow channel through which the refrigerant liquid discharged from a discharging port of the pump is drawn in to be guided to the outside of the heat generating portion cooling unit through the fin portion, and a second flow channel through which the refrigerant liquid cooled at a refrigerant cooling portion after being guided to the outside is drawn in to be guided towards a sucking port of the pump. More specifically, the heat generating portion cooling unit includes a case member, a fin portion, a heat transfer member, and a pressing member. On the outer surface side of the case member, a first inlet portion serving as an inlet portion of the first flow channel, a first outlet portion serving as an outlet portion of the first flow channel, a second inlet portion serving as an inlet portion of the second flow channel, and a second outlet portion serving as an outlet portion of the second flow channel are formed, and on the inner surface side of the case member, a first concave portion that is in communication with the first inlet portion and extends along the inner surface, and a second concave portion that is in communication with the second inlet portion and the second outlet portion are formed. The fin portion includes plural fins made of heat conductive material, and forms a part of the first flow channel in gaps between opposed surfaces of the plural fins to release the heat to the refrigerant liquid that flows in the gaps. The heat transfer member is made of heat conductive material to conduct the heat from the heat generating portion of the electronic device towards the fin portion. The pressing member is made of flexible material, and is arranged between the case member and the fin portion. In the pressing member, a through-hole is provided at a position corresponding to the first concave portion of the case member. The pressing member forms the first flow channel while allowing the first concave portion to be in communication with the fin portion side through the through-hole, and together with the second concave portion, forms a part of the second flow channel while covering an opening portion of the second concave portion.

DETAILED DESCRIPTION OF THE PREFERRED EMBODIMENT

Hereinafter, an embodiment of the present invention will be described using the drawings.

Figure 1:
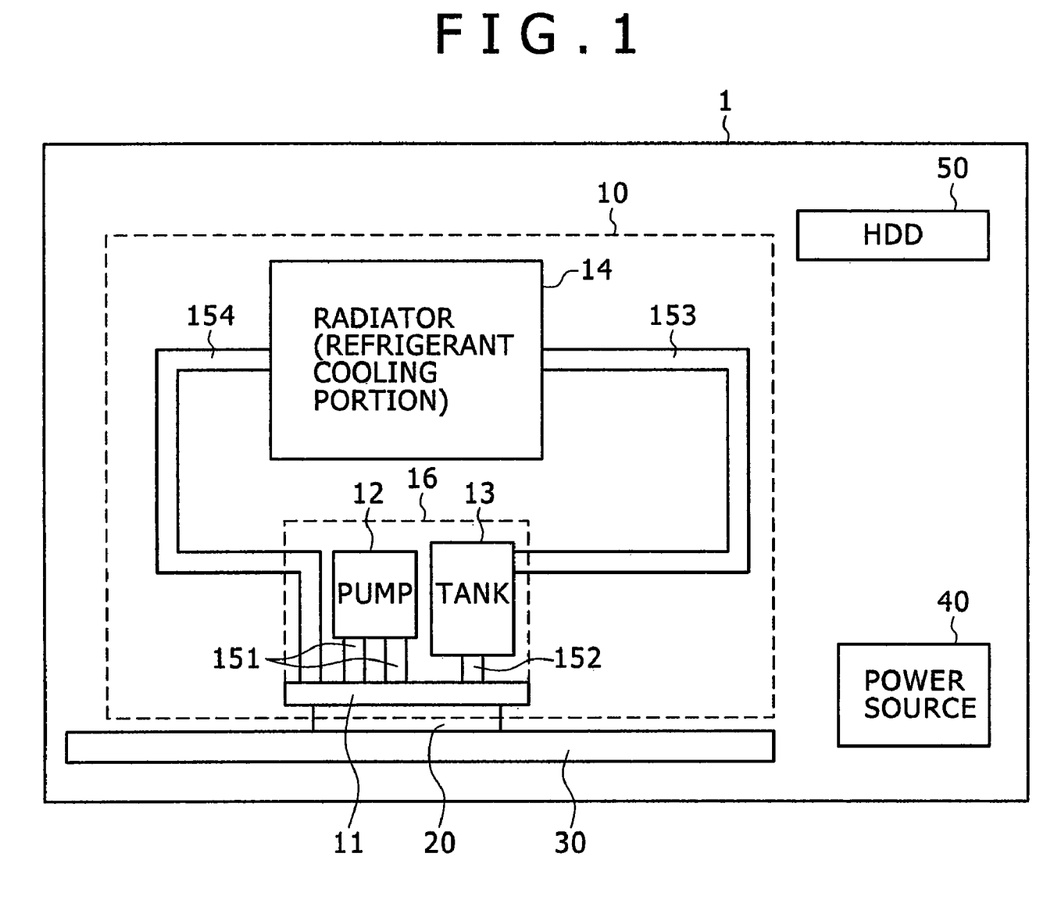
FIG. 1 is a block diagram showing the entire configuration of an electronic device cooling apparatus as an embodiment of the present invention.
Figure 2:
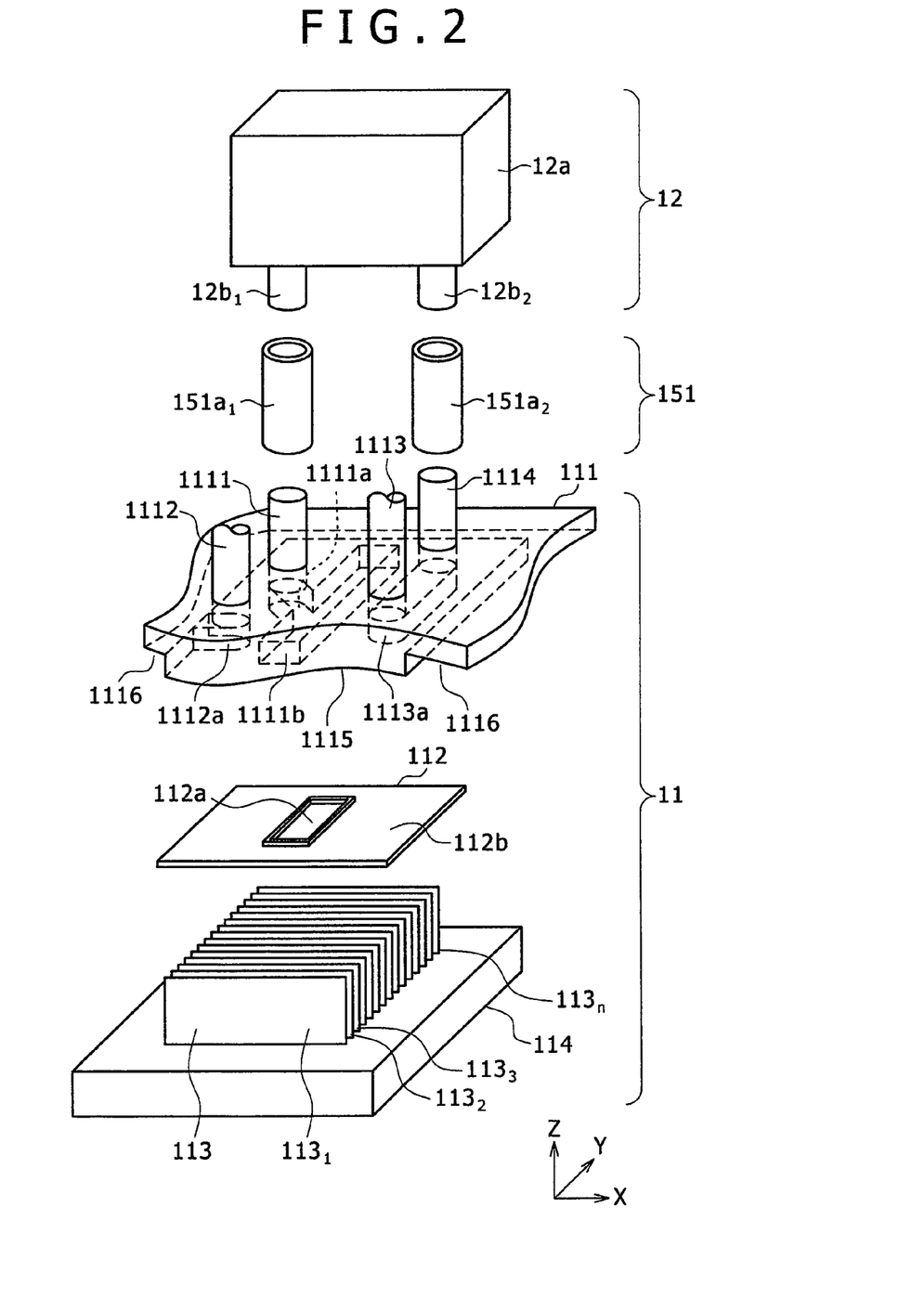
FIG. 2 is a view showing an internal configuration of a heat generating portion cooling unit and a connecting state between the heat generating portion cooling unit and a pump in the electronic device cooling apparatus of FIG. 1.
Figure 3:
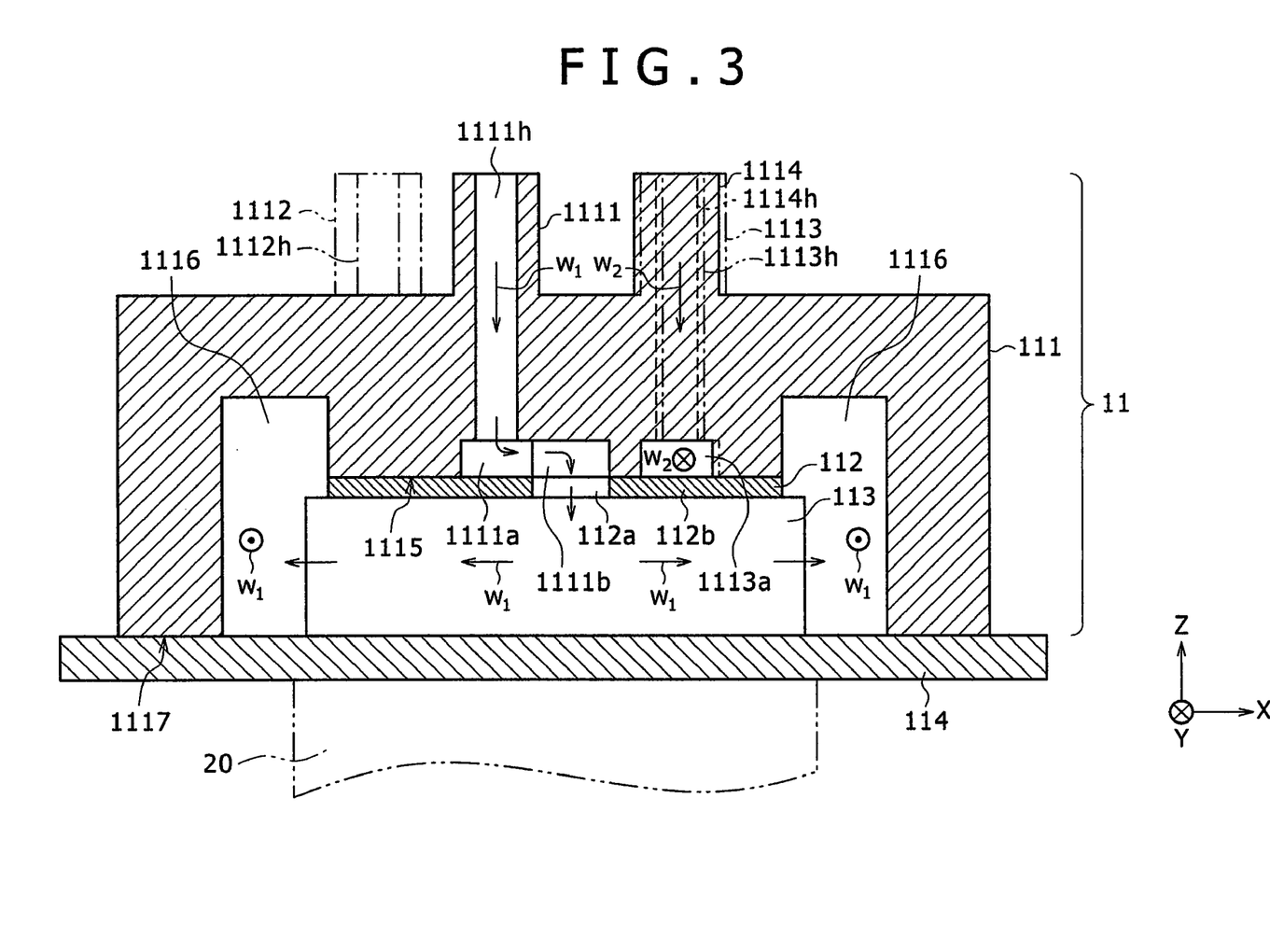
FIG. 3 is a cross sectional view of a configuration of the heat generating portion cooling unit in the electronic device cooling apparatus of FIG. 1.
Figure 4:
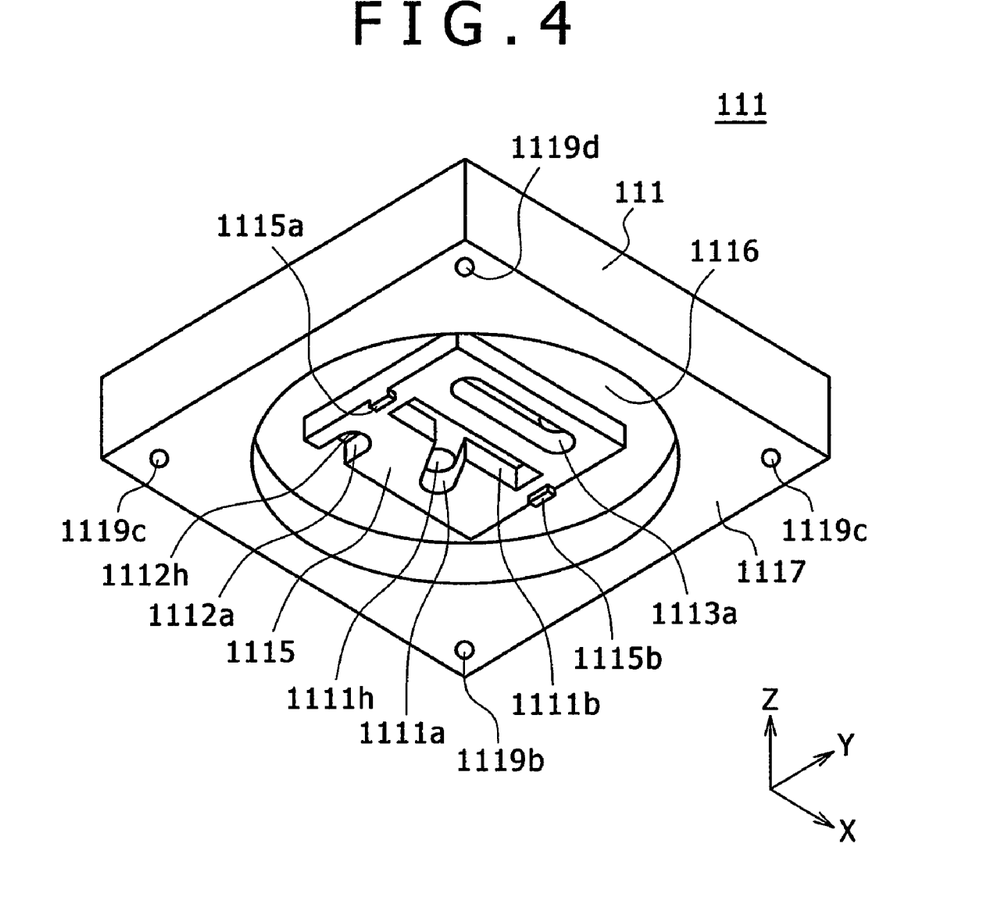
FIG. 4 is a perspective view showing a configuration on the inner surface side of a case member used for the heat generating portion cooling unit in the electronic device cooling apparatus of FIG. 1.
Figure 5:
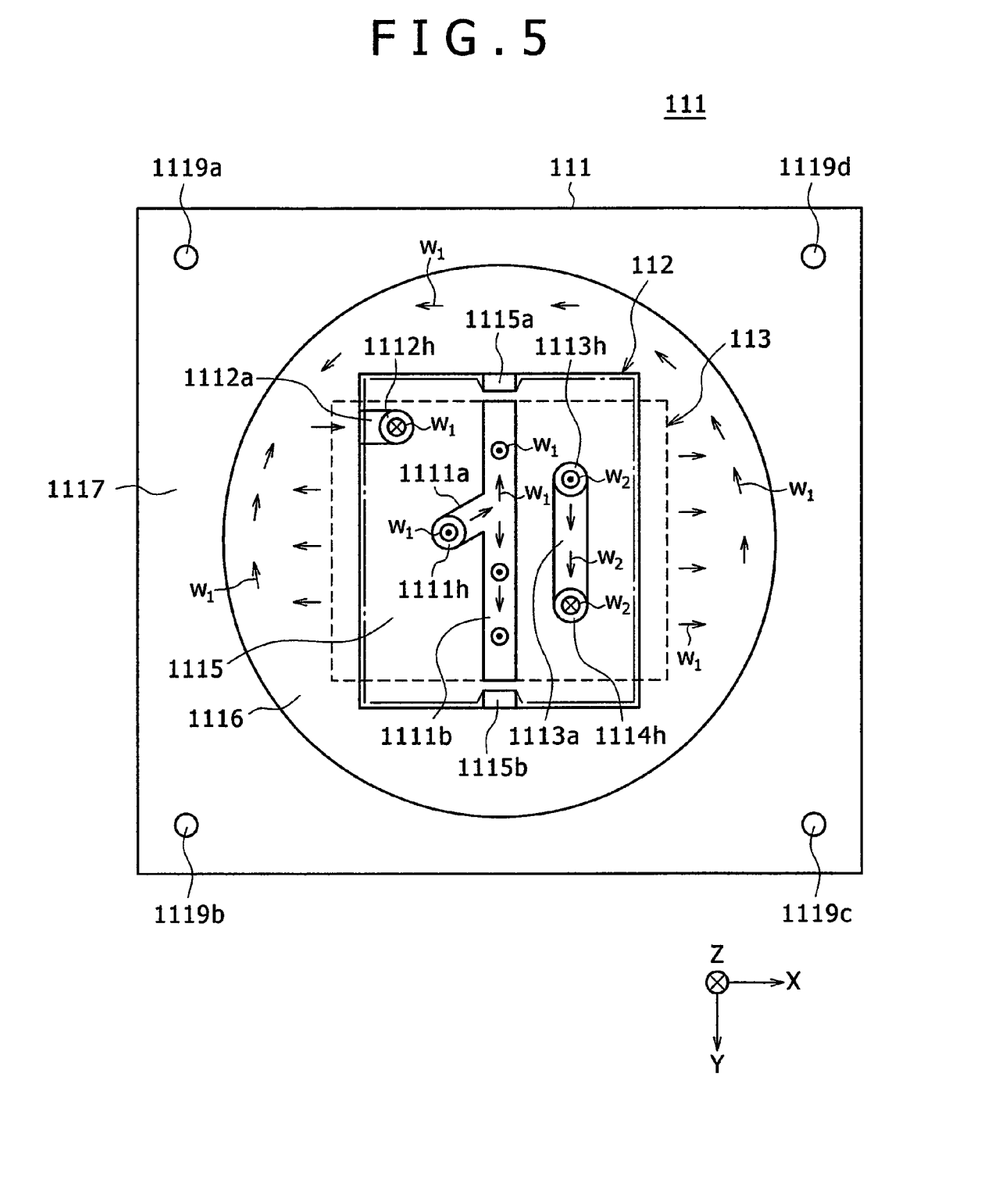
FIG. 5 is a plan view showing a configuration on the inner surface side of the case member used for the heat generating portion cooling unit in the electronic device cooling apparatus of FIG. 1.

FIGS. 1 to 5 are explanatory views of an electronic device cooling apparatus as an embodiment of the present invention. FIG. 1 is a block diagram showing the entire configuration of the electronic device cooling apparatus according to the embodiment of the present invention, FIG. 2 is a view showing an internal configuration of a heat generating portion cooling unit and a connecting state between the heat generating portion cooling unit and a pump in the electronic device cooling apparatus of FIG. 1, FIG. 3 is a cross sectional view of a configuration of the heat generating portion cooling unit in the electronic device cooling apparatus of FIG. 1, FIG. 4 is a perspective view showing a configuration on the inner surface side of a case member used for the heat generating portion cooling unit in the electronic device cooling apparatus of FIG. 1, and FIG. 5 is a plan view showing a configuration on the inner surface side of the case member used for the heat generating portion cooling unit in the electronic device cooling apparatus of FIG. 1.

FIG. 1 is a block diagram showing the entire configuration of the electronic device cooling apparatus as an embodiment of the present invention, and shows a state in which the electronic device cooling apparatus is mounted in an electronic device.

In FIG. 1, the reference numeral 1 denotes an electronic device such as a personal computer, 10 denotes an electronic device cooling apparatus (hereinafter, referred to as a cooling apparatus) as an embodiment of the present invention, 20 denotes a heat generating portion (e.g. a semiconductor integrated circuit such as a CPU) to be cooled by the cooling apparatus 10 among heat generating portions in the electronic device 1, 30 denotes a circuit substrate on which the heat generating portion 20 is provided, 40 denotes a power source, 50 denotes a hard disk drive apparatus (HDD), 11 denotes a heat generating portion cooling unit which releases heat from the heat generating portion 20 to refrigerant liquid in the cooling apparatus 10 to cool the heat generating portion 20, 12 denotes a pump in the cooling apparatus 10, 13 denotes a tank for temporarily storing therein the refrigerant liquid in the cooling apparatus 10, 14 denotes a radiator as a refrigerant cooling portion for cooling the refrigerant liquid in the cooling apparatus 10, 151 to 154 denote piping members, and 16 denotes a cover for covering the pump 12 and the tank 13. The pump 12, the heat generating portion cooling unit 11, the tank 13 and the radiator 14 configure a cooling system for cooling the heat generating portion 20 while circulating the refrigerant liquid. The pump 12 discharges and draws in the refrigerant liquid so as to allow the refrigerant liquid to circulate and flow in the cooling system. The heat generating portion cooling unit 11 is connected to the pump 12, and releases the heat received from the heat generating portion 20 to the refrigerant liquid through a fin portion (not shown) provided in the heat generating portion cooling unit 11 so as to cool the heat generating portion 20. The heat generating portion cooling unit 11 receives the heat from the heat generating portion 20 through a heat transfer member (no shown) provided in the heat generating portion cooling unit 11, transfers the heat to the fin portion, and releases the heat to the refrigerant liquid that flows in the fin portion. The radiator 14 releases the heat contained in the refrigerant liquid that flows out of the heat generating portion cooling unit 11 side, that is, the refrigerant liquid that flows out of the tank 13, and cools the refrigerant liquid. It is assumed that the radiator 14 is configured in such a manner that its heat releasing portion includes, for example, a core tube and a fin. In the embodiment, the heat generating portion cooling unit 11 is arranged so as to be overlapped on the heat generating portion 20, and the pump 12 and the tank 13 are arranged above the heat generating portion cooling unit 11. In addition, the cover 16 that covers the pump 12 and the tank 13 is fixed to the heat generating portion cooling unit 11. The piping members 151 connect between a discharging port of the pump 12 and the heat generating portion cooling unit 11 and between the heat generating portion cooling unit 11 and a sucking port of the pump 12. The piping member 152 connects between the heat generating portion cooling unit 11 and the tank 13. The piping member 153 connects between the tank 13 and the radiator 14. The piping member 154 connects between the radiator 14 and the heat generating portion cooling unit 11. In the embodiment, it is assumed that, for example, water is used as refrigerant liquid.

The heat generating portion cooling unit 11 is configured to include therein a first flow channel (not shown) through which the refrigerant liquid discharged from the discharging port of the pump 12 is drawn in, is allowed to flow in the region of the fin portion, and then is guided to the outside of the heat generating portion cooling unit 11, that is, the tank 13 side, and a second flow channel (not shown) through which the refrigerant liquid cooled after being guided to the outside of the heat generating portion cooling unit 11 and passing through the radiator 14 is guided towards the sucking port of the pump 12. The first and second flow channels are independently provided at different positions.

In the above configuration, the refrigerant liquid discharged from the discharging port of the pump 12 flows into the first flow channel of the heat generating portion cooling unit 11, and receives the heat of the heat generating portion 20 at the fin portion in the first flow channel so that the temperature of the refrigerant liquid rises. The refrigerant liquid whose temperature rises flows out of the heat generating portion cooling unit 11, and flows into the radiator (refrigerant cooling portion) 14 through the tank 13. The heat of the refrigerant liquid that flows into the radiator 14 is partially released to the outside at the radiator 14, so that the refrigerant liquid is cooled and the temperature thereof is lowered. The cooled refrigerant liquid flows into the second flow channel of the heat generating portion cooling unit 11, flows out of the heat generating portion cooling unit 11 through the second flow channel, and flows into the pump 12 from the sucking port of the pump 12. The refrigerant liquid that flows into the pump 12 is discharged from the discharging port, and flows into the first flow channel of the heat generating portion cooling unit 11. The refrigerant is allowed to circulate and flow in the cooling system in the above-described manner.

FIG. 2 is a view showing an internal configuration of the heat generating portion cooling unit 11 and a connecting state between the heat generating portion cooling unit 11 and the pump 12 in the cooling apparatus (electronic device cooling apparatus) 10 of FIG. 1.

Hereinafter, the respective constituent elements of FIG. 1 used in the description are given the same reference numerals as in the case of FIG. 1.

In FIG. 2, the reference numeral 12a denotes a main body portion (pump main body) of the pump 12, $12b_1$ denotes the discharging port from which the refrigerant is discharged by the pump 12, $12b_2$ is the sucking port from which the refrigerant is sucked by the pump 12, 111 denotes a case member that configures the heat generating portion cooling unit 11, 112 denotes a pressing member that similarly configures the heat generating portion cooling unit 11, 113 denotes a fin portion that similarly configures the heat generating portion cooling unit 11, 114 denotes a heat transfer member that similarly configures the heat generating portion cooling unit 11, and $113_1$, $113_2$, $113_3$ to $113_n$ denote plural plate-like fins that configure the fin portion 113.

The case member 111 is excellent in heat resistance, and the coefficient of thermal expansion is substantially equal to that of the heat transfer member 114. The case member 111 is made of plastic material that is high in mechanical strength, and includes inlet portions into which the refrigerant liquid flows and outlet portions out of which the refrigerant liquid flows on the outer surface side (the outer surface side of the case member). The case member 111 includes a concave portion (first concave portion) that forms a part of the first flow channel and a concave portion (second concave portion) that forms the second flow channel on the inner surface side (on the inner surface side of the case member). Each of the inlet and outlet portions is configured to include a through-hole that is provided inside a protrusion portion. In the case member 111, the reference numeral 1111 denotes a first inlet portion serving as an inlet portion of the first flow channel that is formed on the outer surface side of the case member, 1112 denotes a first outlet portion serving as an outlet portion of the first flow channel that is similarly formed on the outer surface side, 1113 denotes a second inlet portion serving as an inlet portion of the second flow channel that is similarly formed on the outer surface side, 1114 denotes a second outlet portion serving as an outlet portion of the second flow channel that is similarly formed on the outer surface side, $1111b$ denotes a first concave portion which is formed on the inner surface side of the case member to be in communication with the first inlet portion 1111 and which extends along the inner surface, $1111a$ denotes a communicating portion which is similarly formed on the inner surface side of the case member so as to allow the first inlet portion 1111 to be in communication with the first concave portion $1111b$, $1113a$ denotes a second concave portion which is similarly formed on the inner surface side of the case member so as to allow the second inlet portion 1113 to be in communication with the second outlet portion 1114, 1115 denotes a plane portion on which the first concave portion $1111b$, the communicating portion $1111a$, and the second concave portion $1113a$ are formed, 1116 denotes a concave portion which encircles the plane portion 1115 and is provided between the plane portion 1115 and an outer peripheral portion on the inner surface side of the case member 111, and $1112a$ denotes a communicating portion which is formed inside the plane portion 1115 in a concave manner so as to allow the concave portion 1116 to be in communication with the first outlet portion 1112. The first inlet portion 1111 is connected to the discharging port $12b_1$ of the pump 12 through a piping member $151a_1$, the first outlet portion 1112 is connected to the tank 13 (FIG. 1) through the piping member 152 (FIG. 1), the second inlet portion 1113 is connected to the radiator 14 (FIG. 1) through the piping member 154, and the second outlet portion 1114 is connected to the sucking port $12b_2$ of the pump 12 through the piping member $151a_2$. The concave portion 1116 also configures a part of the first flow channel, allows the refrigerant liquid that flows out of gaps in the fin portion 113 in the ±X axis direction to flow, and guides the refrigerant liquid to the first outlet portion 1112 through the communicating portion $1112a$.

The pressing member 112 is low in the ratio of impact resilience and the ratio of permanent distortion at the time of compressive deformation, and is made of flexible material with a normal temperature range of −40° C. to 200° C., such as heat-resistant silicon rubber. The pressing member 112 is arranged between the case member 111 and the fin portion 113. In the pressing member 112, the reference numeral 112a denotes a through-hole which is provided at a position corresponding to the first concave portion 1111b, of the case member 111, that forms a part of the first flow channel, and 112b denotes a plane portion surrounding the through-hole 112a. The through-hole 112a allows the first concave portion 1111b to be in communication with the fin portion 113 side so as to form the first flow channel, and covers an opening portion of the second concave portion 1113a so as to, together with the second concave portion 1113a, form the second flow channel. In the embodiment, the shape and dimension of the through-hole 112a are set so as to be substantially equal to those of an opening of the first concave portion 1111b of the case member 111. Accordingly, a side wall of the first flow channel is smoothly formed with less irregularities, and enables smooth flow of the refrigerant liquid that flows from the first concave portion 1111b towards the fin portion 113 through the through-hole 112a. Inside the first concave portion 1111b of the case member 111 and the through-hole 112a of the pressing member 112, the refrigerant liquid flows towards the fin portion 113 while being diffused along the longitudinal direction (±Y axis direction) of the first concave portion 1111b and the through-hole 112a.

The fin portion 113 includes plural plate-like fins $113_1$, $113_2$, $113_3$ to $113_n$ which are made of material (heat conductive material) that is high in thermal conductivity, such as copper and aluminum. Gaps between opposed surfaces of the plural fins $113_1$, $113_2$, $113_3$ to $113_n$ form a part of the first flow channel, and are configured to release the heat to the refrigerant liquid that flows in the gaps. The plural fins $113_1$, $113_2$, $113_3$ to $113_n$ are arranged in the Y axis direction while their planes are directed along the X axis direction. In the case member 111, the first concave portion 1111b and the second concave portion 1113a in the plane portion 1115 are formed within an orthographical region in the Z axis direction of the fin portion 113.

The heat transfer member 114 is made of material (heat conductive material) that is high in thermal conductivity, such as copper and aluminum, and efficiently conducts the heat from the heat generating portion 20 towards the fin portion 113.

The case member 111 and the heat transfer member 114 are coupled to each other in a state where outer peripheral portions thereof are tightly adhered. Since the case member 111 is equal in the coefficient of thermal expansion to the heat transfer member 114, shear and deformation between the members at the outer peripheral portions can be prevented and adhesiveness at the coupling face can be maintained even at the time of temperature change. As a result, the refrigerant liquid is prevented from leaking from, especially, the first flow channel of the heat generating portion cooling unit 11, thus securing the reliability. The pressing member 112 is fixed between the plane portion 1115 of the case member 111 and an end face of the fin portion 113 in the Z axis direction in a state where the pressing member 112 is pressed and compressed by pressing force generated by the coupling between the case member 111 and the fin portion 113. The pressing member 112 itself also generates reaction force in the pressed state, and applies the pressing force as the reaction force to the end face of the fin portion 113 in the Z axis direction and the plane portion 1115 of the case member 111 so as to be tightly adhered to the both. The pressing member 112 in the tightly-adhered state enhances airtightness of the first flow channel formed between the first inlet portion 1111 and the first outlet portion 1112 and airtightness of the second flow channel formed between the second inlet portion 1113 and the second outlet portion 1114, so as to secure the required degree of airtightness. The heat generating portion cooling unit 11 is attached to the electronic device 1 at the outer peripheral portion of the heat transfer member 114.

In the configuration of FIG. 2, the first flow channel corresponds to the flow channel formed, in the heat generating portion cooling unit 11, between the first inlet portion 1111 and the first outlet portion 1112 on the case member 111, that is, the continuous flow channel formed by a space formed by the communicating portion 1111a of the case member 111 and the plane portion 112b of the pressing member 112, a space of the first concave portion 1111b of the case member 111, the through-hole 112a of the pressing member 112, the gaps between the opposed surfaces of the plural fins $113_1$, $113_2$, $113_3$ to $113_n$ of the fin portion 113, a space formed by the concave portion 1116 of the case member 111 and a plane of the heat transfer member 114 in the Z axis direction, and a space formed by the communicating portion 1112a of the case member 111 and the plane portion 112b of the pressing member 112. In addition, the second flow channel corresponds to the flow channel formed, in the heat generating portion cooling unit 11, between the second inlet portion 1113 and the second outlet portion 1114 on the case member 111, that is, a space formed by the second concave portion 1113a of the case member 111 and the plane portion 112b of the pressing member 112. As described above, the first and second flow channels are independently formed at different positions in the heat generating portion cooling unit 11.

In the configuration of FIG. 2, the refrigerant liquid that flows out of the discharging port $12b_1$ of the pump flows into the heat generating portion cooling unit 11 through the piping member $151a_1$. In the heat generating portion cooling unit 11, the refrigerant liquid flows thereinto from the first inlet portion 1111 of the case member 111, and flows into the first concave portion 1111b through the communicating portion 1111a. The refrigerant liquid that flows out of an opening portion of the first concave portion 1111b in the −Z axis direction further flows into the gaps between the opposed surfaces of the plural fins $113_1$, $113_2$, $113_3$ to $113_n$ of the fin portion 113 through the through-hole 112a of the pressing member 112. The refrigerant liquid is allowed to flow in the gaps between the opposed surfaces of the fins in the fin portion 113 in ±X axis direction. During the flow, the refrigerant liquid receives the heat conducted from the heat generating portion 20 (FIG. 1) to the fin portion 113 from the respective fins, and the temperature of the refrigerant liquid rises. The refrigerant liquid whose temperature rises flows into the concave portion 1116 from both of an end face portion in the +X axis direction and an end face portion in the −X axis direction of the fin portion 113, and flows in the concave portion 1116 to reach the first outlet portion 1112 through the communicating portion 1112a. The refrigerant liquid that flows out of the first outlet portion 1112 flows into the radiator (refrigerant cooling portion) 14 (FIG. 1) through the tank 13. The heat of the refrigerant liquid that flows into the radiator 14 is partially released to the outside, so that the refrigerant liquid is cooled and the temperature thereof is lowered. The cooled refrigerant liquid flows into the second inlet portion 1113 of the case member 111 in the heat generating portion cooling unit 11, and then flows into the second concave portion 1113a of the case member 111 that is the second flow channel so as to reach the second outlet portion 1114 of the case member 111 through the second concave portion 1113a. The refrigerant liquid that flows out of the second outlet portion 1114 flows into the sucking port $12b_2$ of the pump 12 through the piping member $151a_2$. As described above, the circulation and flow of the refrigerant liquid in the cooling system prevents the temperature rise of the heat generating portion. The first flow channel and the second flow channel are formed while being brought in contact with the plane of the pressing member 112 and the refrigerant liquid flows in the flow channels. However, portions of the pressing member 112 corresponding to the first concave portion 1111b and the communicating portions 1111a and 1112a are not floated towards the Z axis direction due to the flow.

Hereinafter, the respective constituent elements of FIG. 2 used in the description are given the same reference numerals as in the case of FIG. 2.

FIG. 3 is a cross sectional view of a configuration of the heat generating portion cooling unit 11 in the cooling apparatus (electronic device cooling apparatus) 10 of FIG. 1.

In FIG. 3, the reference numeral 1111h denotes a through-hole in the first inlet portion 1111 of the case member 111, 1112h denotes a through-hole in the first outlet portion 1112 of the case member 111, 1113h denotes a through-hole in the second inlet portion 1113 of the case member 111, and 1114h denotes a through-hole in the second outlet portion 1114 of the case member 111. The through-hole 1111h allows the piping member $151a_1$ to be in communication with the communicating portion 1111a, the through-hole 1112h allows the communicating portion 1112a to be in communication with the piping member 152 (FIG. 1), the through-hole 1113h allows the piping member 154 (FIG. 1) to be in communication with the second concave portion 1113a, and the through-hole 1114h allows the second concave portion 1113a to be in communication with the piping member $151a_2$. The through-hole 1113h and the through-hole 1114h are in communication with each other through the second concave portion 1113a. In the drawing, $w_1$ denotes the flow of the refrigerant liquid in the first flow channel, and $w_2$ denotes the flow of the refrigerant liquid in the second flow channel.

Hereinafter, the respective constituent elements of FIG. 3 used in the description are given the same reference numerals as in the case of FIG. 3.

FIG. 4 is a perspective view showing a configuration on the inner surface side (the surface side in the −Z axis direction) of the case member 111 used for the heat generating portion cooling unit 11 in the cooling apparatus (electronic device cooling apparatus) 10 of FIG. 1.

In FIG. 4, the reference numeral 1117 denotes an outer peripheral portion on the inner surface side of the case member 111, 1119a to 1119d denote through-holes into which coupling members such as screws for coupling the heat transfer member 114 penetrate, 1115a denotes a protruding portion provided at an end portion of the plane portion 1115 in the −Y axis direction, and 1115b denotes a protruding portion provided at an end portion of the plane portion 1115 in the Y axis direction. The other reference numerals denote the same portions as in the cases of FIGS. 2 and 3. The protruding portions 1115a and 1115b are brought into contact with an end portion in the −Y axis direction and an end portion in the Y axis direction of the pressing member 112, respectively, at the plane portion 1115, so as to position the pressing member 112. The height of the plane portion 1115 from the bottom surface of the concave portion 1116 is set lower than that of the outer peripheral portion 1117 from the bottom surface of the concave portion 1116.

FIG. 5 is a plan view on the inner surface side (the surface side in the −Z axis direction) of the case member 111 used for the heat generating portion cooling unit 11 in the cooling apparatus (electronic device cooling apparatus) 10 of FIG. 1. In FIG. 5, the reference numeral $w_1$ denotes the flow of the refrigerant liquid in the first flow channel, and $w_2$ denotes the flow of the refrigerant liquid in the second flow channel. The first concave portion 1111b, the second concave portion 1113a, the through-holes 1111h, 1112h, 1113h, and 1114h, and the communicating portions 1111a and 1112a of the case member 111 are formed within a plane region of the pressing member 112 and an orthographical region of the fin portion 113 in the Z axis direction. The length of the concave portion 1111b of the case member 111 in the Y axis direction is set substantially equal to the width (equal to the width of the fin portion 113 in the Y axis direction) in which the plural plate-like fins $113_1$, $113_2$, $113_3$ to $113_n$ (FIG. 2) of the fin portion 113 are arranged in the Y axis direction. The above-described configuration allows almost the all refrigerant liquid that flows out of the first concave portion 1111b to flow into the gaps between the opposed surfaces of the fins $113_1$, $113_2$, $113_3$ to $113_n$ in the first flow channel. In the configuration of FIG. 5, the plane portion 1115 is formed in a rectangular shape, but may be formed in a shape in which, for example, four corners of the rectangular shape are removed. In the case of the shape in which the four corners are removed, the refrigerant liquid smoothly flows in the concave portion 1116 as compared to the case of the rectangular shape. Further, in the configuration of FIG. 5, the first outlet portion 1112 and the through-hole 1112h are provided within a region of the plane portion 1115 and an orthographical region of the fin portion 113. However, the first outlet portion 1112 and the through-hole 1112h may be provided in, for example, the concave portion 1116.

According to the cooling apparatus (electronic device cooling apparatus) 10 in the embodiment of the present invention, the piping can be simplified, the reliability can be improved, and the downsizing and lower cost of the apparatus can be realized without increasing the dimension of the heat generating portion cooling unit 11. Specifically, since the discharging port $12b_1$ and the sucking port $12b_2$ of the pump 12 are connected to the case member 111 of the heat generating portion cooling unit 11 through the piping members $151a_1$ and $151a_2$ formed by short tubes or the like in the cooling apparatus 10, the pump 12 can be compactly coupled to the heat generating portion cooling unit 11. In addition, when the cooling apparatus 10 is incorporated into the electronic device 1, the piping members, the sucking port of the pump 12, the outflow port for refrigerant liquid of the radiator 14, and the like are prevented from being affected by external force and for being brought into contact with other portions, the reliability of the piping system is improved, and the circuit substrate 30 of the electronic device 1 is prevented from being damaged. Further, the downsizing and low cost of the cooling apparatus 10 can be easily realized. Since there is no need of providing any means for fixing the pump 12, the number of components can be reduced. From this aspect, the downsizing and low coat can be realized. Further, oscillation generated when the pump 12 is driven can be attenuated by the piping members $151a_1$ and $151a_2$, and thus noise reduction in the cooling apparatus 10 and the electronic device 1 provided therewith can be realized.

In the above-described embodiment, the fin portion 113 includes the plural plate-like fins. However, the present invention is not limited to this configuration. Further, in the above-described embodiment, the tank 13, together with the pump 12, is arranged in the cover 16, and is provided at a position on the downstream side of the pump 12 and on the upstream side of the radiator 14 in the cooling system. However, the invention is not limited to this configuration. In the above-described embodiment, the discharging port $12b_1$ and the sucking port $12b_2$ of the pump 12 are connected to the case member 111 of the heat generating portion cooling unit 11. Alternatively, the following configuration can be employed as an example in which the tank 13 is arranged on the upstream side of the heat generating portion cooling unit 11, the outflow port for refrigerant liquid of the tank 13 is connected to the first flow channel of the heat generating portion cooling unit 11, and the inflow port for refrigerant liquid of the tank 13 is connected to the second flow channel of the heat generating portion cooling unit 11. In this case, the refrigerant liquid that flows out of the tank 13 cools the heat generating portion 20 through the fin portion 113. Further, the materials of the fin portion 113 and the heat transfer member 114 are not limited to copper and aluminum, but may be those having the coefficient of thermal conductivity enough to configure the heat generating portion cooling unit 11. Furthermore, the tank 13 may be integrally configured with the radiator 14. Moreover, in the above-described embodiment, the cross section of the first concave portion $1111b$ at a plane orthogonal to the $-Z$ axis direction is formed in a substantially rectangular shape. However, the present invention is not limited to this configuration. The cross section thereof may be formed in a shape in which the refrigerant liquid can be efficiently supplied to a position in the fin portion 113 where the heat from the heat generating portion 20 of the electronic device 1 is largely conducted. For example, in the case where the heat from the heat generating portion 20 is largely conducted to an end portion in the fin portion 113 in the Y axis direction, when the cross section of the first concave portion $1111b$ at a plane orthogonal to the $-Z$ axis direction is formed in a wedge shape spreading in the Y axis direction so as to largely flow the refrigerant liquid into the gaps between the fins at the end portion, the heat generating portion 20 can be efficiently cooled.

In the above-described configuration, the discharging port $12b_1$ of the pump 12 is connected to the first inlet portion 1111 of the case member 111 of the heat generating portion cooling unit 11 through the piping member $151a_1$, and the sucking port $12b_2$ of the pump 12 is connected to the second outlet portion 1114 of the case member 111 through the piping member $151a_2$. Alternatively, for example, the discharging port $12b_1$ of the pump 12 may be connected to the second inlet portion 1113 through the piping member, and the sucking port $12b_2$ may be connected to the first outlet portion 1112 through the piping member. In the case of this configuration, the refrigerant liquid that flows out of the discharging port $12b_1$ of the pump 12 flows into the second concave portion $1113a$ from the second inlet portion 1113 of the case member 111, flows in the second concave portion $1113a$, and flows out of the second outlet portion 1114 of the case member 111 to the outside of the heat generating portion cooling unit 11. The refrigerant liquid that flows to the outside flows into, for example, the radiator 14 through the tank 13. The refrigerant liquid that flows out of the radiator 14 flows into the heat generating portion cooling unit 11 from the first inlet portion 1111 of the case member 111. The refrigerant liquid that flows in from the first inlet portion 1111 flows into the first concave portion $1111b$ through the communicating portion $1111a$, is diffused in the first concave portion $1111b$, and flows out of the opening portion of the first concave portion $1111b$ in the $-Z$ axis direction. The refrigerant liquid that flows out of the opening portion further flows into the gaps between the opposed surfaces of the plural fins $113_1$, $113_2$, $113_3$ to $113_n$ of the fin portion 113 through the through-hole $112a$ of the pressing member 112. In the fin portion 113, the refrigerant liquid flows in the gaps between the opposed surfaces of the fins in the $\pm X$ axis direction. During the flow, the refrigerant liquid receives the heat conducted to the fin portion 113 from the heat generating portion 20 (FIG. 1) from the respective fins, so that temperature thereof rises. The refrigerant liquid whose temperature rises flows into the concave portion 1116 from both of an end face portion in the $+X$ axis direction and an end face portion in the $-X$ axis direction of the fin portion 113, and flows in the concave portion 1116 to reach the first outlet portion 1112 through the communicating portion $1112a$. The refrigerant liquid that flows out of the first outlet portion 1112 flows into the sucking port $12b_2$ of the pump 12 through the piping member. In the case of the connection configuration, the refrigerant liquid right after passing through the fin portion 113 is sucked to the pump 12, so that the refrigerant liquid whose dust, dirt and the like are removed in the fin portion 113 can be sucked to the pump 12, thus improving the cleaning level of the refrigerant liquid that circulates in the cooling system.

The present invention can be implemented in other embodiments without departing from its spirit or main characteristics. Accordingly, the above-described embodiment is merely one example of the present invention in the all aspects, and should not be construed in a limited way. The scope of the present invention is shown by the claims. Further, changes and modifications belonging to a scope equivalent to that of the claims are all within the scope of the present invention.

What is claimed is:

1. An electronic device cooling apparatus which allows refrigerant liquid to circulate and flow in a cooling system by using a pump so as to cool a heat generating portion of an electronic device, the apparatus comprising:
   a heat generating portion cooling unit which is connected to the pump and releases heat received from the heat generating portion to the refrigerant liquid through a fin portion so as to cool the heat generating portion; and
   a refrigerant cooling portion which cools the refrigerant liquid that has received heat from the fin portion, the refrigerant liquid flowing out of the heat generating portion cooling unit,
   wherein the heat generating portion cooling unit includes therein separately a first flow channel through which the refrigerant liquid discharged from a discharging port of the pump flows to the outside of the heat generating portion cooling unit through the fin portion which forms a part of the first flow channel, and a second flow channel through which the refrigerant liquid that is guided to the outside and passes through the refrigerant cooling portion flows towards a sucking port of the pump, each of the first and second flow channels being sealed with a pressing member which is made of flexible material and located in the heat generating portion cooling unit, and the pressing member forming a part of each of the first and second flow channels; and
   wherein each of the discharging port and the sucking port of the pump is connected to the heat generating portion cooling unit through a piping member.

2. The electronic device cooling apparatus according to claim 1,
   wherein the heat generating portion cooling unit includes:
   a case member on an outer surface side of which a first inlet portion serving as an inlet portion of the first flow channel, a first outlet portion serving as an outlet portion of the first flow channel, a second inlet portion serving as an inlet portion of the second flow channel, and a second outlet portion serving as an outlet portion of the second flow channel are formed, and on an inner surface side of which a first concave portion that is in communication with the first inlet portion and extends along the inner surface to form a part of the first flow channel, and a second concave portion that is in communication with the second inlet portion and the second outlet portion to form the second flow channel are formed; and a heat transfer member which is made of heat conductive material to conduct the heat from the heat generating portion of the electronic device towards the fin portion, wherein:

the fin portion includes a plurality of fins made of heat conductive material, and forms a part of the first flow channel in gaps between opposed surfaces of the plurality of fins to release heat to the refrigerant liquid that flows in the gaps;

the pressing member is arranged between the case member and the fin portion, in which a through-hole is provided at a position corresponding to the first concave portion of the case member, and forms a part of the first flow channel while allowing the first concave portion to be in communication with the fin portion side through the through-hole, and, together with the second concave portion, forms the second flow channel while covering an opening portion of the second concave portion; and each of the discharging port and the sucking port of the pump is connected to the case member through a piping member.

3. The electronic device cooling apparatus according to claim 2, wherein the case member has a configuration in which the first concave portion and the second concave portion are formed within a projective region of the fin portion on the inner surface side of the case member.

4. The electronic device cooling apparatus according to claim 2, wherein the case member has a configuration in which the first concave portion, a communicating portion which allows the first concave portion to be in communication with the first inlet portion, and the second concave portion are arranged in a plane portion on the inner surface side of the case member, a concave portion is formed between the plane portion and an outer peripheral portion while encircling the plane portion, and the concave portion configures a part of the first flow channel to guide the refrigerant liquid that flows out of the gaps of the fin portion to the first outlet portion.

5. The electronic device cooling apparatus according to claim 3, wherein the case member has a configuration in which the first concave portion, a communicating portion which allows the first concave portion to be in communication with the first inlet portion, and the second concave portion are arranged in a plane portion on the inner surface side of the case member, a concave portion is formed between the plane portion and an outer peripheral portion while encircling the plane portion, and the concave portion configures a part of the first flow channel to guide the refrigerant liquid that flows out of the gaps of the fin portion to the first outlet portion.

6. The electronic device cooling apparatus according to claim 1, wherein the electronic device is a personal computer and the refrigerant liquid is water.

7. The electronic device cooling apparatus according to claim 2, wherein the electronic device is a personal computer and the refrigerant liquid is water.

8. The electronic device cooling apparatus according to claim 3, wherein the electronic device is a personal computer and the refrigerant liquid is water.

9. The electronic device cooling apparatus according to claim 4, wherein the electronic device is a personal computer and the refrigerant liquid is water.

10. The electronic device cooling apparatus according to claim 5, wherein the electronic device is a personal computer and the refrigerant liquid is water.

11. An electronic device cooling apparatus which allows refrigerant liquid to circulate and flow in a cooling system by using a pump so as to cool a heat generating portion of an electronic device, the apparatus comprising:

a heat generating portion cooling unit which is connected to the pump and releases heat received from the heat generating portion to the refrigerant liquid through a fin portion so as to cool the heat generating portion; and a refrigerant cooling portion which cools the refrigerant liquid that is to flow into a side of the heat generating portion cooling unit, wherein:

the heat generating portion cooling unit includes therein separately a first flow channel through which the refrigerant liquid that passes through the refrigerant cooling portion flows towards a sucking port of the pump through the fin portion, the pump being located outside the heat generating portion cooling unit, and a second flow channel through which the refrigerant liquid discharged from a discharging port of the pump flows to the outside of the heat generating portion cooling unit, each of the first and second flow channels being sealed with a pressing member which is made of flexible material and located in the heat generating portion cooling unit, and the pressing member forming a part of each of the first and second flow channels; and each of the discharging port and the sucking port of the pump is connected to the heat generating portion cooling unit through a piping member.

12. An electronic device including a cooling apparatus which allows refrigerant liquid to circulate and flow in a cooling system by using a pump and a heat generating portion to be cooled by the cooling apparatus, wherein:

the cooling apparatus includes:

a heat generating portion cooling unit which is connected to the pump and releases heat received from the heat generating portion to the refrigerant liquid through a fin portion so as to cool the heat generating portion; and a refrigerant cooling portion which cools the refrigerant liquid that flows out of a side of the heat generating portion cooling unit, wherein:

the heat generating portion cooling unit includes therein separately a first flow channel through which the refrigerant liquid discharged from a discharging port of the pump flows to the outside of the heat generating portion cooling unit through the fin portion, and a second flow channel through which the refrigerant liquid that is guided to the outside and passes through the refrigerant cooling portion flows towards a sucking port of the pump, each of the first and second flow channels being sealed with a pressing member which is made of flexible material and located in the heat generating portion cooling unit, and the pressing member forming a part of each of the first and second flow channels;

the heat generating portion is an electronic circuit on a circuit substrate of the electronic device; and each of the discharging port and the sucking port of the pump is connected to the heat generating portion cooling unit through a piping member.

13. The electronic device according to claim 12,
wherein the heat generating portion cooling unit includes:
a case member on an outer surface side of which a first inlet portion serving as an inlet portion of the first flow channel, a first outlet portion serving as an outlet portion of the first flow channel, a second inlet portion serving as an inlet portion of the second flow channel, and a second outlet portion serving as an outlet portion of the second flow channel are formed, and on an inner surface side of which a first concave portion that is in communication with the first inlet portion and extends along the inner surface to form a part of the first flow channel, and a second concave portion that is in communication with the second inlet portion and the second outlet portion to form the second flow channel are formed;
the fin portion which includes a plurality of fins made of heat conductive material and forms a part of the first flow channel in gaps between opposed surfaces of the plurality of fins to release heat to the refrigerant liquid that flows in the gaps;
a heat transfer member which is made of heat conductive material to conduct the heat from the heat generating portion of the electronic device towards the fin portion; and
the pressing member which is arranged between the case member and the fin portion, wherein:
the pressing member has a through-hole at a position corresponding to the first concave portion of the case member and forms a part of the first flow channel while allowing the first concave portion to be in communication with the fin portion side through the through-hole, and, together with the second concave portion, forms the second flow channel while covering an opening portion of the second concave portion.

14. The electronic device according to claim 13,
wherein the case member has a configuration in which the first concave portion and the second concave portion are formed within a projective region of the fin portion on the inner surface side of the case member.

15. The electronic device according to claim 13,
wherein the case member has a configuration in which the first concave portion, a communicating portion which allows the first concave portion to be in communication with the first inlet portion, and the second concave portion are arranged in a plane portion on the inner surface side of the case member, a concave portion is formed between the plane portion and an outer peripheral portion while encircling the plane portion, and the concave portion configures a part of the first flow channel to guide the refrigerant liquid that flows out of the gaps of the fin portion to the first outlet portion.

16. The electronic device according to claim 14,
wherein the case member has a configuration in which the first concave portion, a communicating portion which allows the first concave portion to be in communication with the first inlet portion, and the second concave portion are arranged in a plane portion on the inner surface side of the case member, a concave portion is formed between the plane portion and an outer peripheral portion while encircling the plane portion, and the concave portion configures a part of the first flow channel to guide the refrigerant liquid that flows out of the gaps of the fin portion to the first outlet portion.

* * * * *